US012369367B2

(12) United States Patent
Cheng et al.

(10) Patent No.: US 12,369,367 B2
(45) Date of Patent: *Jul. 22, 2025

(54) BULK NANOSHEET WITH DIELECTRIC ISOLATION

(71) Applicant: Adeia Semiconductor Solutions LLC, San Jose, CA (US)

(72) Inventors: Kangguo Cheng, Schenectady, NY (US); Bruce B. Doris, Slingerlands, NY (US); Junli Wang, Slingerlands, NY (US)

(73) Assignee: Adeia Semiconductor Solutions LLC, San Jose, CA (US)

( * ) Notice: Subject to any disclaimer, the term of this patent is extended or adjusted under 35 U.S.C. 154(b) by 159 days.

This patent is subject to a terminal disclaimer.

(21) Appl. No.: 17/892,827

(22) Filed: Aug. 22, 2022

(65) Prior Publication Data

US 2023/0197781 A1 Jun. 22, 2023

Related U.S. Application Data

(63) Continuation of application No. 16/452,251, filed on Jun. 25, 2019, now Pat. No. 11,456,354, which is a (Continued)

(51) Int. Cl.
*H10D 62/10* (2025.01)
*H01L 21/762* (2006.01)
(Continued)

(52) U.S. Cl.
CPC ..... *H10D 62/121* (2025.01); *H01L 21/76213* (2013.01); *H01L 21/7624* (2013.01);
(Continued)

(58) Field of Classification Search
CPC ............. H01L 29/0673; H01L 29/0665; H01L 29/42392; H01L 29/66439; H01L 21/76281; H01L 21/7624; H01L 21/76213
See application file for complete search history.

(56) References Cited

U.S. PATENT DOCUMENTS 7,871,873 B2   1/2011   Maszara et al.
8,422,273 B2   4/2013   Chang et al.
(Continued)

FOREIGN PATENT DOCUMENTS

CN   104393036 A      3/2015
WO   2011162725 A1   12/2011

OTHER PUBLICATIONS

English translation of CN104393036 A by Ren Zheng et al. Mar. 4, 2015 (13 pages).
List of IBM Patents or Applications Treated as Related (2 pages).

*Primary Examiner* — Tuan A Hoang
(74) *Attorney, Agent, or Firm* — Haley Guiliano LLP

(57) ABSTRACT

Techniques for dielectric isolation in bulk nanosheet devices are provided. In one aspect, a method of forming a nanosheet device structure with dielectric isolation includes the steps of: optionally implanting at least one dopant into a top portion of a bulk semiconductor wafer, wherein the at least one dopant is configured to increase an oxidation rate of the top portion of the bulk semiconductor wafer; forming a plurality of nanosheets as a stack on the bulk semiconductor wafer; patterning the nanosheets to form one or more nanowire stacks and one or more trenches between the nanowire stacks; forming spacers covering sidewalls of the nanowire stacks; and oxidizing the top portion of the bulk semiconductor wafer through the trenches, wherein the oxidizing step forms a dielectric isolation region in the top portion of the bulk semiconductor wafer. A nanowire FET and method for formation thereof are also provided.

20 Claims, 11 Drawing Sheets

Related U.S. Application Data continuation of application No. 15/642,690, filed on Jul. 6, 2017, now Pat. No. 10,374,035, which is a continuation of application No. 14/919,451, filed on Oct. 21, 2015, now Pat. No. 9,741,792.

(51) Int. Cl.

| | | |
|---|---|---|
| *H10D 30/01* | (2025.01) | |
| *H10D 30/67* | (2025.01) | |
| *H10D 62/17* | (2025.01) | |
| *H10D 62/834* | (2025.01) | |
| *H10D 64/01* | (2025.01) | |
| *H10D 86/00* | (2025.01) | |
| *H10D 86/01* | (2025.01) | |

(52) U.S. Cl.
CPC ..... *H01L 21/76281* (2013.01); *H10D 30/014* (2025.01); *H10D 30/6735* (2025.01); *H10D 30/6757* (2025.01); *H10D 62/118* (2025.01); *H10D 62/364* (2025.01); *H10D 62/834* (2025.01); *H10D 64/017* (2025.01); *H10D 86/01* (2025.01); *H10D 86/011* (2025.01); *H10D 86/201* (2025.01); *H10D 86/215* (2025.01)

(56) References Cited

U.S. PATENT DOCUMENTS

| | | |
|---|---|---|
| 8,927,397 B2 | 1/2015 | Chang et al. |
| 8,941,156 B2 | 1/2015 | Bergendahl et al. |
| 8,969,934 B1 | 3/2015 | Cheng et al. |
| 8,987,794 B2 | 3/2015 | Rachmady et al. |
| 9,029,834 B2 | 5/2015 | Bangsaruntip et al. |
| 9,048,087 B2 | 6/2015 | Wu et al. |
| 9,741,792 B2 | 8/2017 | Cheng et al. |
| 10,312,323 B2 * | 6/2019 | Cheng ................ H01L 27/1203 |
| 10,374,035 B2 | 8/2019 | Cheng et al. |
| 2012/0138886 A1 | 6/2012 | Kuhn et al. |
| 2013/0181263 A1 | 7/2013 | Cai et al. |
| 2014/0124863 A1 | 5/2014 | Cheng et al. |
| 2014/0127878 A1 | 5/2014 | Assefa et al. |
| 2014/0175374 A1 * | 6/2014 | Chang ................... B82Y 40/00 977/762 |
| 2014/0225065 A1 * | 8/2014 | Rachmady ........... H10D 62/235 438/283 |
| 2014/0326952 A1 | 11/2014 | Kuhn et al. |
| 2015/0024559 A1 | 1/2015 | Xiao et al. |
| 2015/0083999 A1 | 3/2015 | Cheng et al. |
| 2015/0084001 A1 | 3/2015 | Cheng et al. |
| 2015/0137078 A1 | 5/2015 | Guo et al. |
| 2015/0144880 A1 | 5/2015 | Rachmady et al. |
| 2015/0155287 A1 | 6/2015 | Heo et al. |

\* cited by examiner

BULK NANOSHEET WITH DIELECTRIC ISOLATION

CROSS-REFERENCE TO RELATED APPLICATIONS

This application is a continuation of U.S. application Ser. No. 16/452,251 filed on Jun. 25, 2019, which is a continuation of U.S. application Ser. No. 15/642,690 filed on Jul. 6, 2017, now U.S. Pat. No. 10,374,035, which is a continuation of U.S. application Ser. No. 14/919,451 filed on Oct. 21, 2015, now U.S. Pat. No. 9,741,792, the disclosure of each of which is incorporated by reference herein.

FIELD OF THE INVENTION

The present invention relates to nanosheet devices, and more particularly, to techniques for dielectric isolation in nanosheet devices starting with a bulk semiconductor wafer.

BACKGROUND OF THE INVENTION

Nanosheet process flows usually begin with an silicon-on-insulator (SOI) wafer. See, for example, U.S. Pat. No. 8,422,273 issued to Chang et al., entitled "Nanowire Mesh FET with Multiple Threshold Voltages" (hereinafter "U.S. Pat. No. 8,422,273"). With an SOI wafer, isolation between adjacent devices is provided by way of the buried insulator (often an oxide referred to as a buried oxide or BOX). For instance, as described in U.S. Pat. No. 8,422,273, the SOI layer present on the BOX serves as the first layer in a nanosheet stack. SOI technology however requires additional processing steps such as wafer bonding or oxygen implantation to create the buried insulator beneath the SOI layer.

Thus, for ease and efficiency of manufacture, improved techniques for nanosheet isolation would be desirable.

SUMMARY OF THE INVENTION

The present invention provides techniques for dielectric isolation in nanosheet devices starting with a bulk semiconductor wafer. In one aspect of the invention, a method of forming a nanosheet device structure with dielectric isolation is provided. The method includes the steps of: optionally implanting at least one dopant into a top portion of a bulk semiconductor wafer, wherein the at least one dopant is configured to increase an oxidation rate of the top portion of the bulk semiconductor wafer; forming a plurality of nanosheets as a stack on the bulk semiconductor wafer; patterning the nanosheets to form one or more nanowire stacks and one or more trenches between the nanowire stacks; forming spacers covering sidewalls of the nanowire stacks; and oxidizing the top portion of the bulk semiconductor wafer through the trenches, wherein the oxidizing step forms a dielectric isolation region in the top portion of the bulk semiconductor wafer.

In another aspect of the invention, a method of forming a nanowire field effect transistor (FET) device is provided. The method includes the steps of: optionally implanting at least one dopant into a top portion of a bulk semiconductor wafer, wherein the at least one dopant is configured to increase an oxidation rate of the top portion of the bulk semiconductor wafer; forming a plurality of nanosheets as a stack on the bulk semiconductor wafer, wherein the plurality of nanosheets comprises alternating layers of a sacrificial material and a channel material as the stack on the bulk semiconductor wafer; patterning the nanosheets to form one or more nanowire stacks and one or more trenches between the nanowire stacks; forming spacers covering sidewalls of the nanowire stacks; oxidizing the top portion of the bulk semiconductor wafer through the trenches, wherein the oxidizing step forms a dielectric isolation region in the top portion of the bulk semiconductor wafer; removing the spacers; selectively removing portions of the layers of the sacrificial material from the nanowire stacks in a channel region of the FET device releasing portions of the channel material from the nanowire stacks, wherein the portions of the channel material released from the nanowire stacks form nanowire channels of the FET device; and forming a gate surrounding the nanowire channels in the channel region of the device.

In yet another aspect of the invention, a nanowire FET device is provided. The nanowire FET device includes: a bulk semiconductor wafer having a dielectric isolation region in a top portion thereof, wherein the dielectric isolation region includes a thermal oxide; nanowire stacks on the bulk semiconductor wafer, wherein each of the nanowire stacks comprises alternating layers of a sacrificial material and a channel material, and wherein portions of the channel material are released from the nanowire stacks in a channel region of the FET device and comprise nanowire channels of the FET device; and a gate surrounding the nanowire channels in the channel region of the device.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for dielectric isolation in nanosheet structures beginning with a bulk wafer. By contrast, as provided above, nanosheet-based fabrication processes typically begin with a silicon-on-insulator (SOI) wafer. By enabling nanosheet fabrication with bulk wafer technology, one can vastly increase processing flexibility and open the door for different wafer configurations. The term nanosheet, as used herein, refers to a sheet or a layer having nanoscale dimensions. Further, the term nanosheet may also be used interchangeably herein with the term nanowire when referring to a particular structure. For instance, nanosheet can be used to refer to a nanowire with a larger width, and/or nanowire may be used to refer to a nanosheet with a smaller width, and vice versa.

Figure 1:
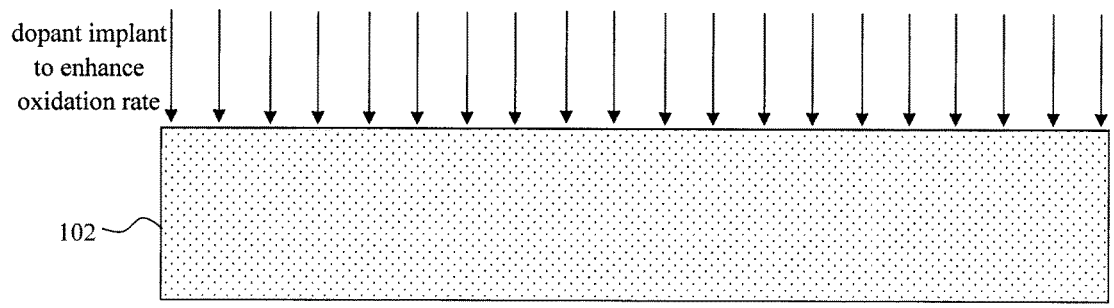
FIG. 1 is a cross-sectional diagram illustrating a bulk semiconductor wafer, and a dopant(s) being implanted into the bulk semiconductor wafer to increase an oxidation rate thereof according to an embodiment of the present invention.

As shown in FIG. 1, the process begins with a bulk semiconductor wafer 102. By way of example only, bulk semiconductor wafer 102 can include silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof.

As will be described in detail below, an oxidation step will be performed later in the process to create a dielectric (isolation) region in the bulk semiconductor wafer 102. To enhance this oxidation process, it is preferable at this stage to implant a dopant(s) into the bulk semiconductor wafer 102 that will increase the oxidation rate. For instance, as is known in the art, the presence of fluorine or fluorine-containing compounds can lead to an enhanced oxide growth rate.

Thus, according to an exemplary embodiment, one or more dopants are implanted into the bulk semiconductor wafer 102 to enhance (i.e., increase) the oxidation rate. See FIG. 1. Suitable dopants include, but are not limited to, fluorine (F), phosphorous (P), and combinations thereof. The dopant(s) may be implanted at a dose of from about $5\times10^{15}$ to about $5\times10^{16}$, and ranges therebetween. According to an exemplary embodiment, the bulk semiconductor wafer 102 has a thickness of from about 0.1 millimeters (mm) to about 0.75 mm, and ranges therebetween, and the dopant is implanted into a top portion 202 of the bulk semiconductor wafer 102, wherein the top portion 202 includes a first from about 100 angstroms (Å) to about 500 Å, and ranges therebetween, of the bulk semiconductor wafer 102. See, for example, FIG. 2—described below.

Following the dopant implant, it is desirable to perform a post-implantation anneal. A post-implantation anneal can serve to remove damage created by the implantation process. By way of example only, the post-implantation anneal can be carried out a temperature of from about 750° C. to about 1,000° C., and ranges therebetween, for a duration of from about 30 minutes to about 6 hours, and ranges therebetween.

Figure 2:
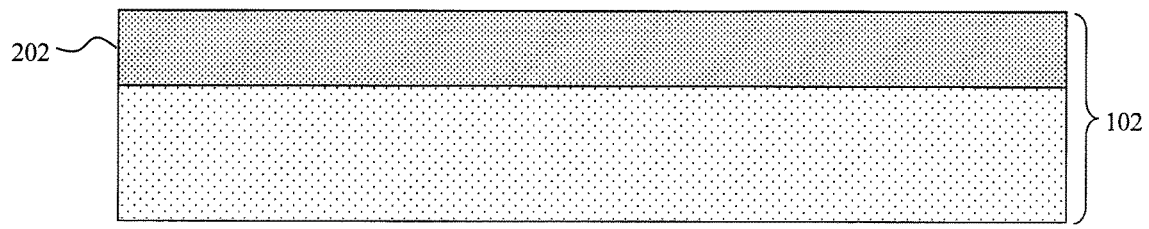
FIG. 2 is a cross-sectional diagram illustrating the dopant having been implanted into a top portion of the bulk semiconductor wafer according to an embodiment of the present invention.

As shown in FIG. 2, the result of the implantation process is the formation of a doped portion 202 in the top of the bulk semiconductor wafer 102. This portion 202 may also be referred to herein as an implantation region of the bulk semiconductor wafer 102.

It is notable that while the faster oxidation rate achieved via the implantation process will facilitate creating the dielectric (isolation) region in the bulk semiconductor wafer 102, the process can in fact be performed without the implantation. Thus embodiments are anticipated herein where the dopant implant is an optional step.

The next task is to form the nanosheets on the wafer. As will be described in detail below, according to one exemplary embodiment this process involves forming (e.g., growing) alternating sacrificial and channel layers in a stack on the wafer. For instance, in the example depicted in the figures, alternating SiGe (sacrificial) and Si (channel) layers are formed in a stack on the wafer. The term sacrificial, as used herein, means a layer or other structure, that is (or a part thereof is) removed before completion of the final device. For instance, in the example being described, portions of the sacrificial SiGe layers will be removed from the stack in the channel region of the device to permit the Si channel layers to be released from the stack. It is notable that while in the present example SiGe and Si form the sacrificial and channel layers, respectively, any combination of sacrificial and channel materials may be employed in accordance with the present techniques. For example, one might instead employ selective etching technology which permits Si to be used as the sacrificial material between SiGe channel layers.

Figure 3:
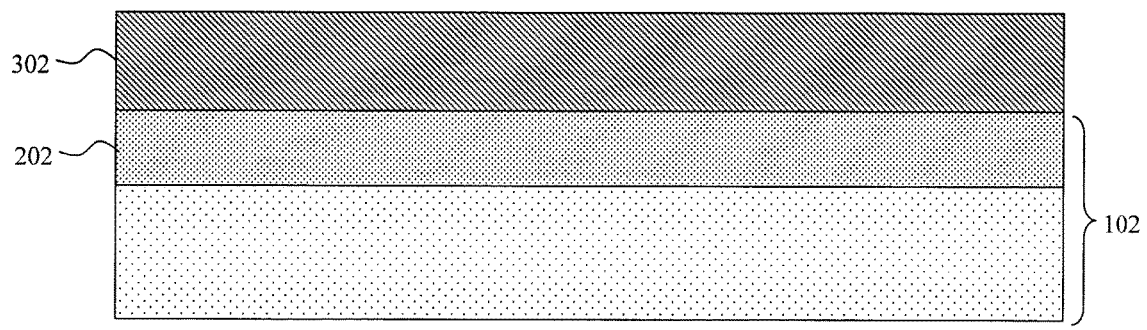
FIG. 3 is a cross-sectional diagram illustrating a (sacrificial) silicon germanium (SiGe) layer having been formed on the bulk semiconductor wafer according to an embodiment of the present invention.

In the present example, as shown in FIG. 3 a first layer in the stack (a sacrificial layer), i.e., a SiGe layer 302, is formed on the wafer. According to an exemplary embodiment, the layers in the stack are formed using an epitaxial growth process. In that case, SiGe layer 302 is formed from epitaxial SiGe.

It is notable that the first layer in the stack (in this case SiGe layer 302) will be oxidized (later in the process) and will need more room to prevent oxidation of the channel layers. See below. Thus, it is preferable that the first layer in the stack is thicker than the others. By way of example only, SiGe layer 302 may be formed having a thickness of from about 20 nm to about 35 nm, and ranges therebetween. By contrast, the other layers in the stack can have a thickness of from about 10 nm to about 25 nm, and ranges therebetween. Accordingly, each of the layers in the stack have nanoscale dimensions, and thus are also referred to herein as nanosheets. Further, as highlighted above, the Si layers in the stack above the SiGe layer 302 will be used to form the channel layers of the device. Thus, the dimensions of the Si layers dictate the dimensions of the channel layers.

Figure 4:
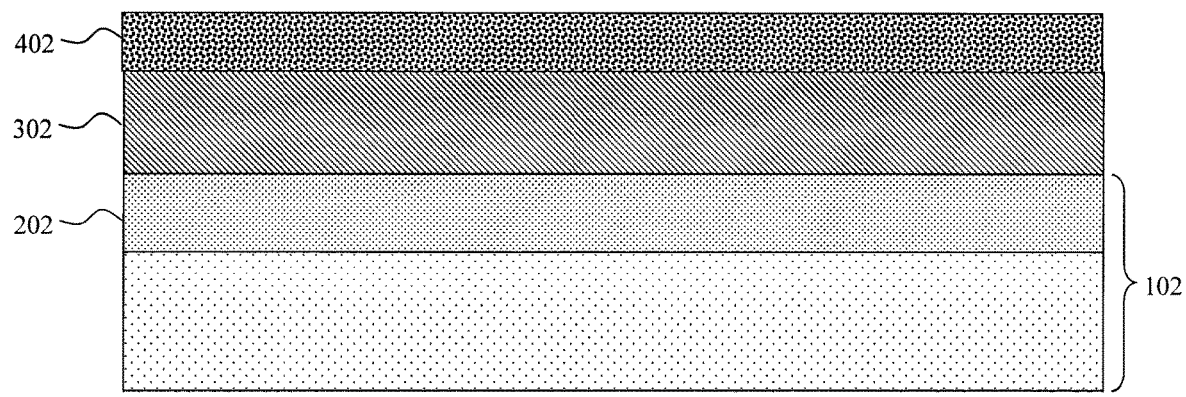
FIG. 4 is a cross-sectional diagram illustrating a (channel) silicon (Si) layer having been formed on the SiGe layer creating a stack of alternating SiGe and Si layers on the wafer according to an embodiment of the present invention.

To continue building the stack, an Si layer 402 (a channel layer) is next formed on the SiGe layer 302. See FIG. 4. As provided above, according to an exemplary embodiment the layers in the stack are formed using an epitaxial growth process. In that case, Si layer 402 is formed from epitaxial Si. As also provided above, the layers in the stack above the SiGe layer 302 can be thinner. For example, Si layer 402 can have a thickness of from about 10 nm to about 25 nm, and ranges therebetween.

As highlighted above, the goal is to produce a stack of alternating (sacrificial and channel) SiGe and Si layers on the wafer. This configuration is also referred to herein as a super lattice, i.e., a periodic structure of layers of two (or more) materials. The number of layers in the stack can be tailored depending on the particular application. Thus, the configurations depicted and described herein are merely examples meant to illustrate the present techniques. For instance, the present super lattice structures can contain more or fewer layers than are shown in the figures.

Figure 5:
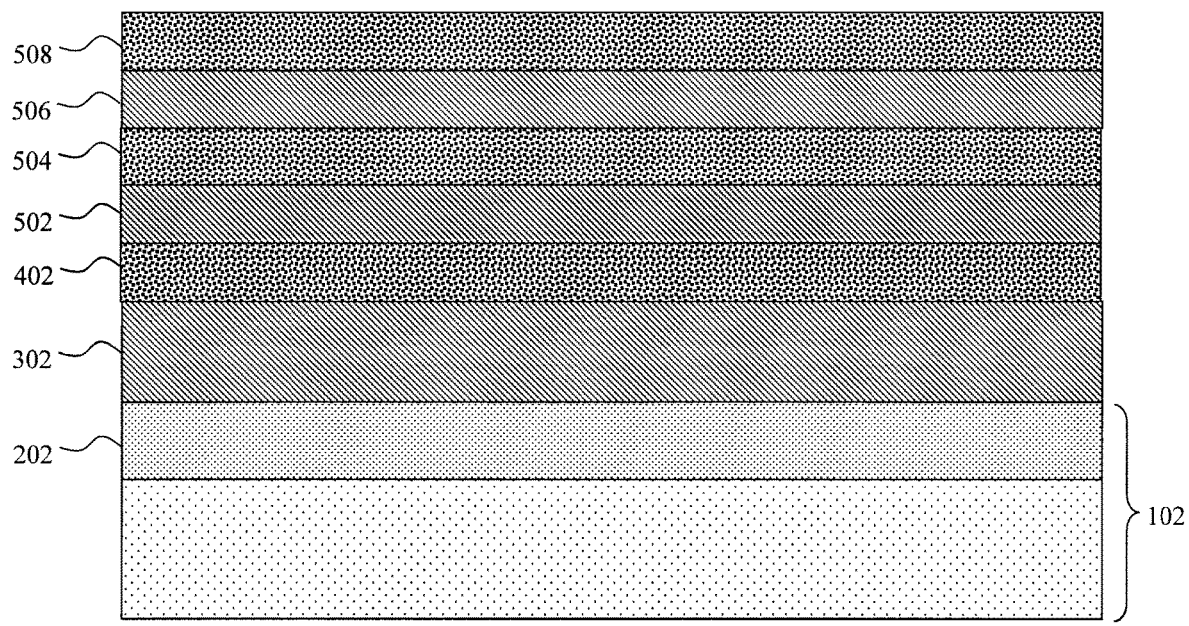
FIG. 5 is a cross-sectional diagram illustrating additional (sacrificial/channel) SiGe and Si layers having been added to the stack according to an embodiment of the present invention.

As shown in FIG. 5, the stack is grown by adding (sacrificial) SiGe layers 502, 506, etc. and (channel) Si layers 504, 508, etc. in an alternating manner onto Si layer 402. Each of these additional layers of the stack can be formed in the same manner as described above, e.g., using an epitaxial growth process, to a thickness, e.g., of from about 10 nm to about 25 nm, and ranges therebetween.

The next stage in the process includes opening up the stack so as to permit oxidation of (portion 202) of the underlying bulk semiconductor wafer 102. As will be described in detail below, this process involves patterning one or more trenches in the stack through which access to the bulk semiconductor wafer 102 can be gained, and then oxidizing the bulk semiconductor wafer 102 through the trenches. The layers in the stack are protected during the oxidation process using sidewall spacers.

Figure 6:
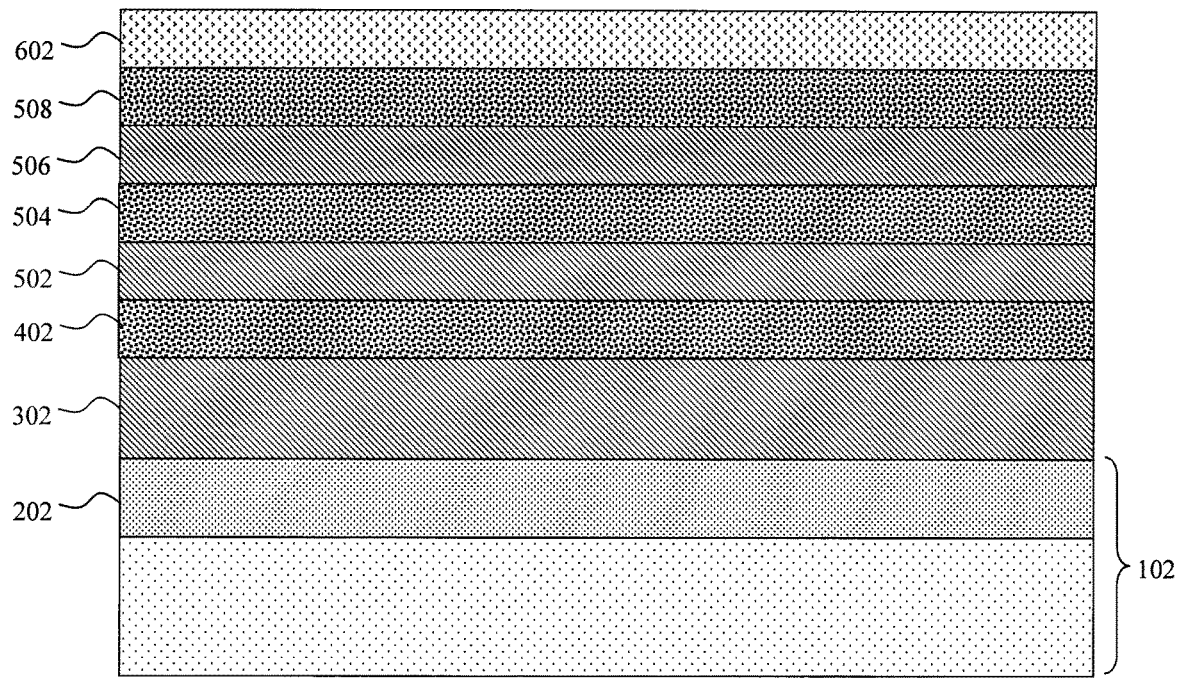
FIG. 6 is a cross-sectional diagram illustrating a hardmask material having been deposited onto the stack according to an embodiment of the present invention.
Figure 7:
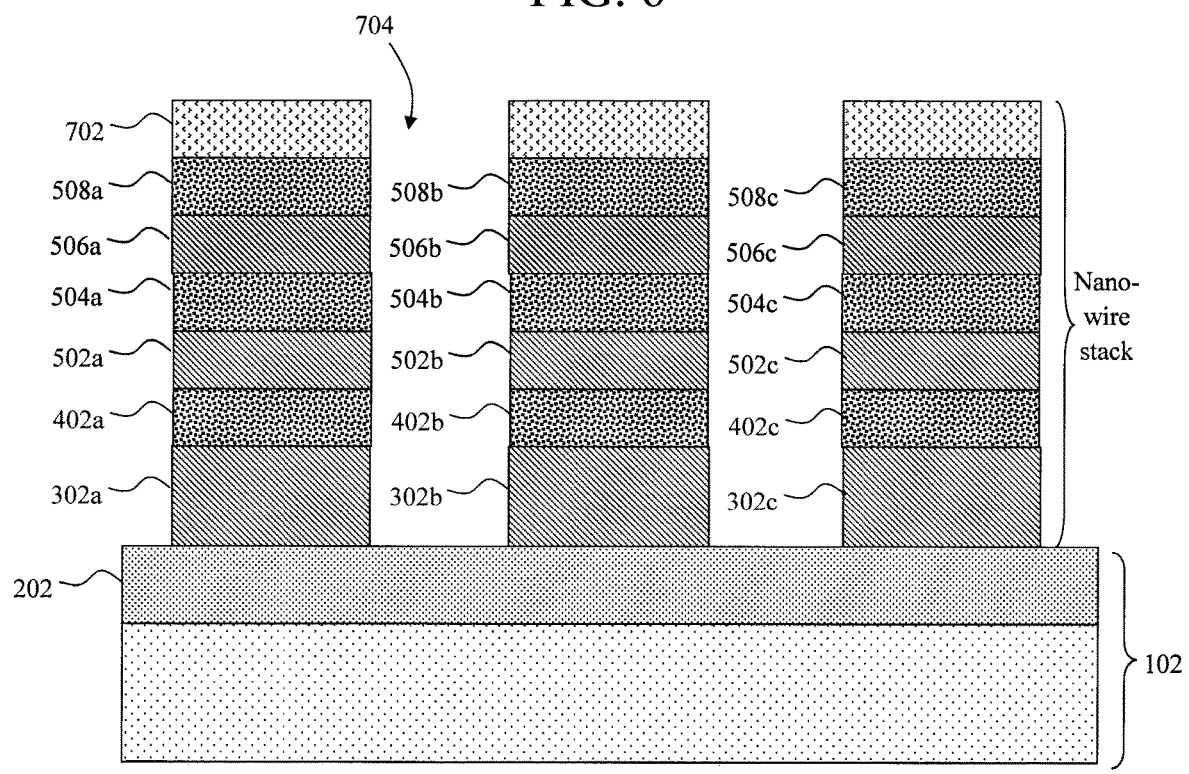
FIG. 7 is a cross-sectional diagram illustrating the hardmask material having been patterned into one or more individual nanowire hardmasks, and the nanowire hardmasks having been used to pattern one or more nanowire stacks and trenches in the stack of sacrificial/channel layers, wherein the trenches extend down to the bulk semiconductor wafer according to an embodiment of the present invention.

Patterning of the stack involves forming a hardmask on the stack. To form the hardmask, a hardmask material 602 is first blanket deposited onto the super lattice stack. See FIG. 6. Suitable hardmask materials include, but are not limited to, nitride hardmask materials such as silicon nitride (SiN). Standard lithography and etching techniques can then be used to pattern the hardmask material 602 into one or more individual nanowire hardmasks 702. See FIG. 7. As shown in FIG. 7, the nanowire hardmasks 702 are then used to pattern one or more nanowire stacks in the super lattice stack. This nanowire patterning step involves forming one or more trenches 704 in the stack which extend through the stack, down to the bulk semiconductor wafer 102. See FIG. 7. As shown in FIG. 7, the top portion 202 of the bulk semiconductor wafer 102 is exposed at the bottom of the trenches 704. As will be described in detail below, oxidation of the top portion 202 of the bulk semiconductor wafer 102 will be performed through the trenches 704, and thus it is through the trenches 704 that access is gained to that top portion 202 of the bulk semiconductor wafer 102.

From the description above, it is apparent that the stack contains alternating layers of different materials. In one exemplary embodiment, the stack includes alternating layers of SiGe and Si. In that case, it may be necessary to employ multiple etching steps to pattern the nanowire stacks/trenches 704 in the stack. For instance, a multi-step reactive ion etching (RIE) process can be employed, wherein a first Si-selective RIE step is used to pattern the topmost Si layer in the stack, followed by a SiGe selective RIE step for the next layer in the stack, and so on. A SiGe-selective RIE can be used to pattern the first layer in the stack (i.e., SiGe layer 302) selective to the bulk semiconductor wafer 102. Post fin-patterning, the SiGe/Si layers in a first one of the nanowires stacks are given the reference numeral "a" (302a, 402a, etc.), the SiGe/Si layers in a second one of the nanowire stacks are given the reference numeral "b" (302b, 402b, etc.), and so on.

Figure 8:
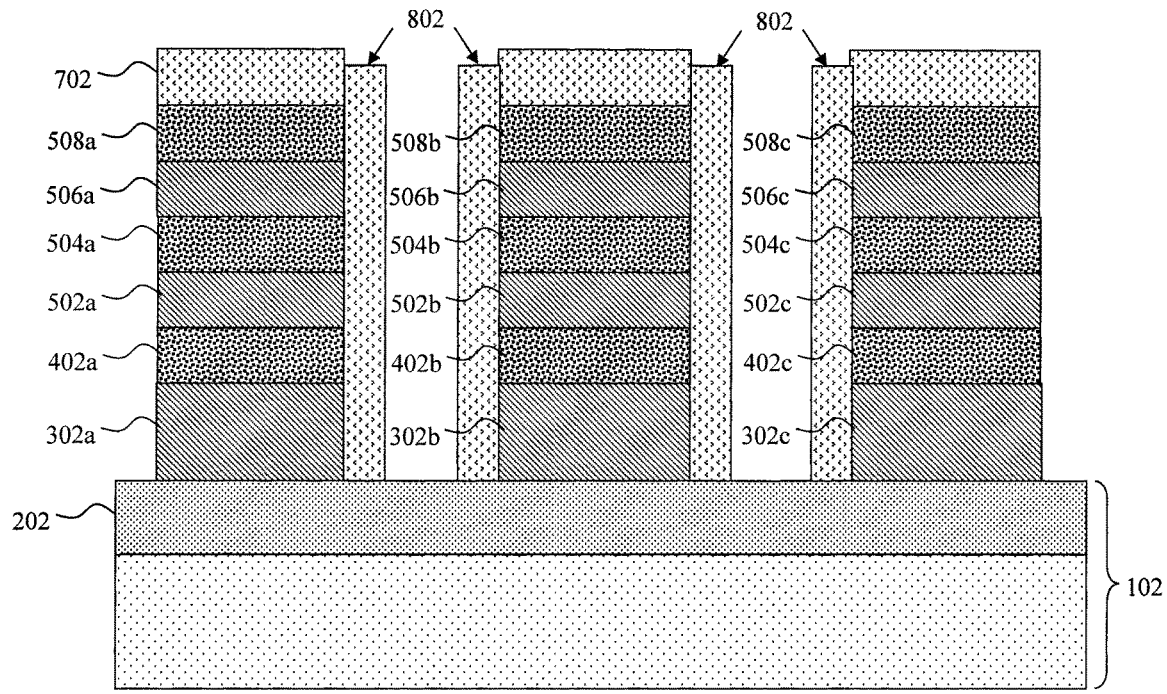
FIG. 8 is a cross-sectional diagram illustrating sidewall spacers having been formed in the trenches covering/protecting the exposed sidewalls of the nanowire stacks according to an embodiment of the present invention.
Figure 9:
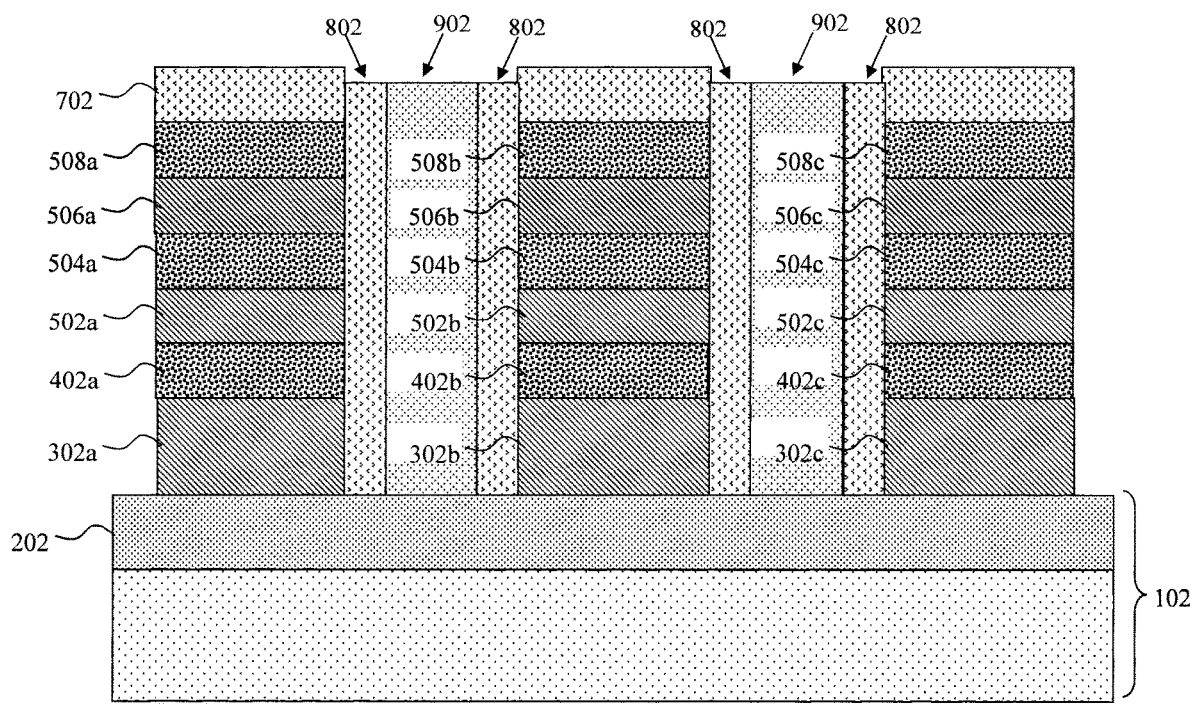
FIG. 9 is a cross-sectional diagram illustrating an optional oxide material having been deposited into the trenches according to an embodiment of the present invention.

As provided above, oxidation of the bulk semiconductor wafer 102 will be carried out through the trenches 704. It is however undesirable to oxidize the layers in the stack. Thus, steps are preferably taken to protect these layers. According to an exemplary embodiment, sidewall spacers 802 are formed in the trenches 704 covering/protecting the exposed sidewalls of the stack. See FIG. 8. According to an exemplary embodiment, the spacers are formed from a nitride material such as SiN. The spacers 802 can be formed using standard lithography and etching techniques. For instance, the spacer material can be deposited onto the stack, and within the trenches 704. An anisotropic etching process, such as RIE, can then be used to pattern the material into the spacers 802 lining the sidewalls of the stack.

The nanowire stacks are now encased in the hardmasks 702 and the spacers 802. However, to provide additional mechanical support for the nanowire stacks during the oxidation process, an oxide material 902 may optionally be deposited into, and filling, the trenches 704. The oxide material 902 in the trenches may also be referred to herein as a trench oxide. As indicated above, the trenches 704 provide access to the top portion (i.e., the implantation region of the bulk semiconductor wafer 102—see above) during the oxidation process that will be used to form a dielectric in (portion 202 of) the bulk semiconductor wafer 102. During the oxidation process, oxygen ions are able to move through the trench oxide and into the bulk semiconductor wafer 102.

According to an exemplary embodiment, the trench oxide is silicon dioxide ($SiO_2$). $SiO_2$ may be deposited using, e.g., a high density plasma (HDP) chemical vapor deposition (CVD) process.

Oxidation of the bulk semiconductor wafer 102 is next carried out to form a dielectric isolation region 1002 in the top portion 202 (i.e., the implantation region of the bulk semiconductor wafer 102) which will isolate the nanowire stacks. See FIG. 10. The oxidation process generally involves annealing the wafer in an oxygen ambient (a process also referred to herein as thermal oxidation). Oxygen ions will access the bulk semiconductor wafer 102 through the trenches 704. As provided above, the top portion 202 of the bulk semiconductor wafer 102 is preferably implanted with dopants (such as fluorine) which will increase the rate of oxidation through this top portion of the wafer. As a result, the top portion 202 of the bulk semiconductor wafer 102 will be converted (via the oxidation process) into a dielectric, while the underlying portions of the bulk semiconductor wafer 102 remain un-oxidized (i.e., since the rate of oxidation is slower through the underlying portions of the wafer, those regions will not be oxidized in the time it takes to oxidize the top portion 202). If a trench oxide is present in the trenches 704, the oxygen ions can easily move through the trench oxide and into the bulk semiconductor wafer 102.

Specifically, the wafer is annealed in an oxygen ambient under conditions sufficient to oxidize the top portion 202 of the bulk semiconductor wafer forming a dielectric isolation region in the top portion of the wafer. According to an exemplary embodiment, the conditions for this thermal oxidation include, but are not limited to, a temperature of from about 750° C. to about 1,500° C., and ranges therebetween, for a duration of from about 60 seconds to about 1 hour, and ranges there between and can be accomplished using rapid thermal processing or a conventional furnace process.

Figure 10:
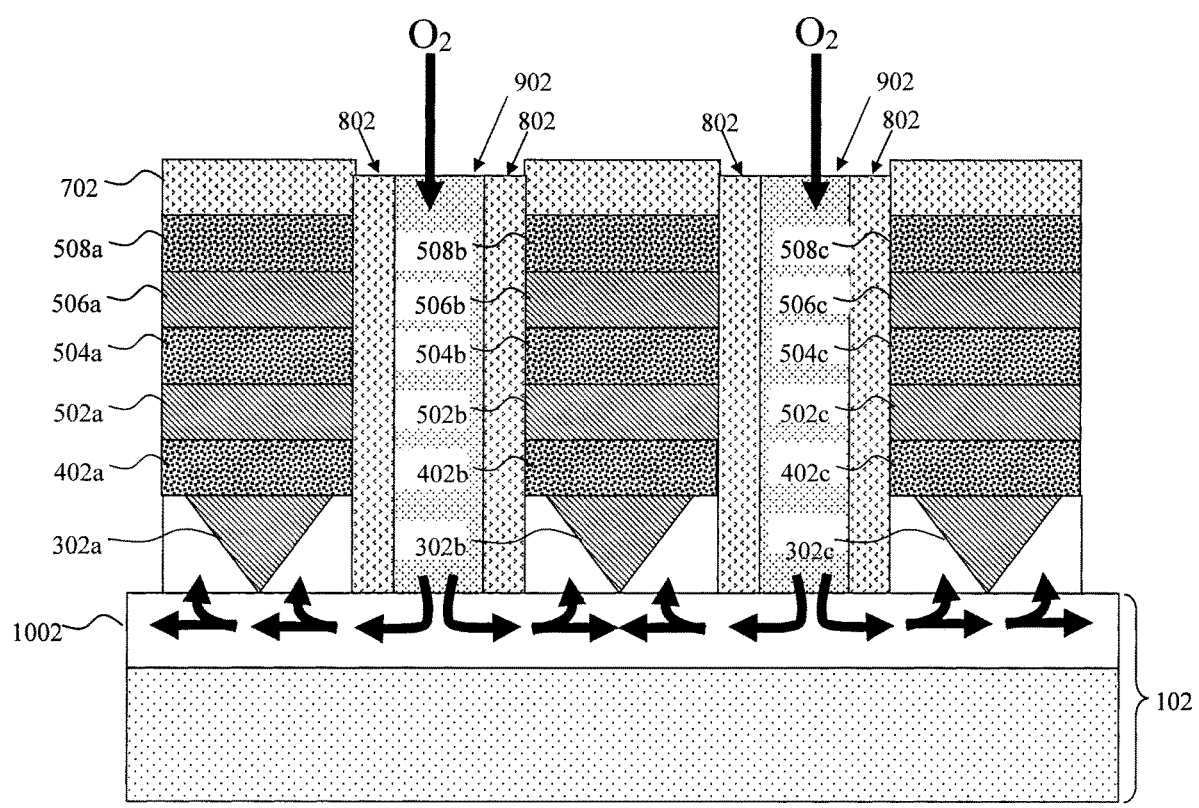
FIG. 10 is a cross-sectional diagram illustrating oxidation of the bulk semiconductor wafer having been performed to form a dielectric isolation region in the top portion of the wafer according to an embodiment of the present invention.

As shown in FIG. 10, oxygen ions can access the top portion 202 of the bulk semiconductor wafer 102 through the trenches 704. If, as in the example shown, the optional oxide material is present in the trenches 704, then the oxygen ions can migrate through that material and into the bulk semiconductor wafer 102. Arrows are provided in FIG. 10 to indicate the path of travel of the oxygen ions to/within the bulk semiconductor wafer 102. As shown in FIG. 10, the oxygen ions will oxidize the top portion 202 of the wafer forming an oxide-based dielectric isolation region 1002. To use a simple example, if the bulk semiconductor wafer 102 is a bulk Si wafer, then the dielectric isolation region 1002 formed via the present oxidation process would be silicon oxide ($SiO_2$). Further, since the top portion of the wafer was implanted with a dopant to increase the rate of oxidation, then the dielectric 1002 will be preferentially formed in this top portion of the wafer.

As shown in FIG. 10, other than a portion of bottommost SiGe layer 302 which is in direct contact with the wafer, the spacers 802 prevent oxidation of the SiGe and Si layers in the nanowire stacks. As provided above, it is preferable for the SiGe layer 302 to be thicker than the other layers in the nanowire stacks. This will serve to compensate for the portion of this layer which is consumed during the oxidation step. Further, since oxidation of the SiGe layer 302 is blocked on the sidewalls of the nanowire stacks by the spacers 802, oxidation of SiGe layer 302 will largely occur at the bottom of the layer and will taper off as one moves further away from the wafer surface. This is why the oxidation process is shown in FIG. 10 to result in a triangular-shaped region of SiGe in the layer 302.

The dielectric isolation region 1002 isolates each of the nanowire stacks. The isolated nanowire stacks formed by the present process can then be used for a variety of different applications. For instance, in one exemplary embodiment, the present super lattice nanowire stack structures are used in fabricating a nanowire mesh field effect transistor (FET). See, for example, FIGS. 11-17. In the example that follows, a gate last approach is employed wherein a sacrificial or dummy gate is placed over the channel region of the device early on in the process. The dummy gate serves as a placeholder and permits the placement of the source and drain regions of the device. Following formation of the source and drain regions, the dummy gate can be removed and replaced with a replacement gate stack. Thus, potential damage to the replacement gate stack (e.g., from processing conditions such as dopant implant and/or activation anneals) can be avoided since the gate stack is not formed until the end of the process.

Figure 11:
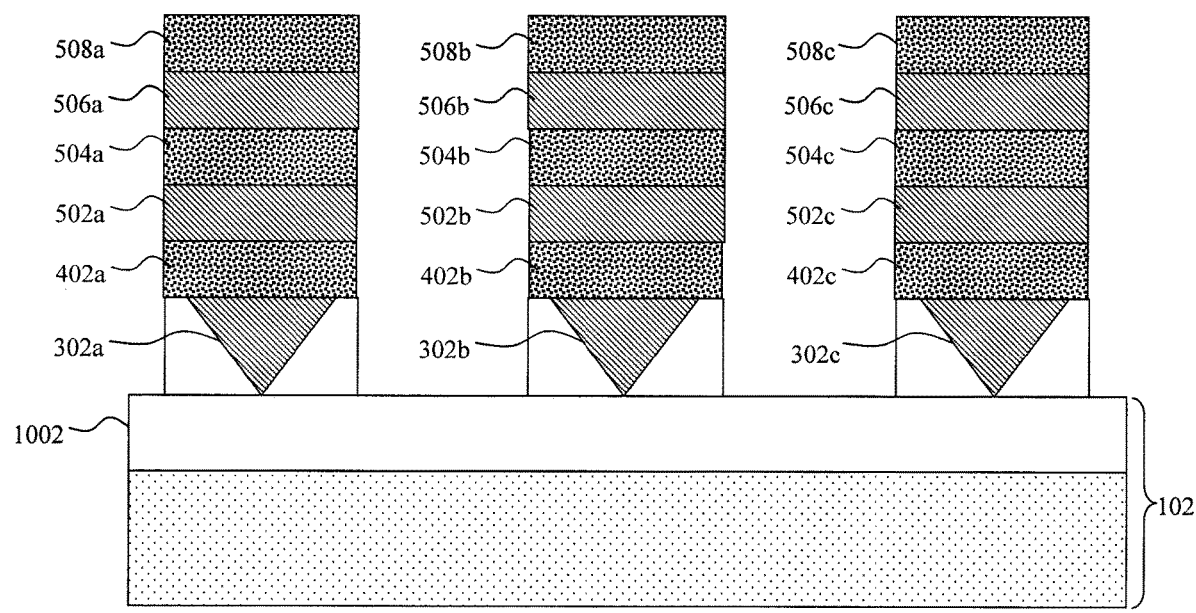
FIG. 11 is a cross-sectional diagram illustrating, according to an exemplary process flow for forming a nanowire mesh field effect transistor (FET) using the present nanowire stack structures, the oxide material, the nanowire hardmasks, and the spacers having been removed from on/between the fins according to an embodiment of the present invention.

As shown in FIG. 11, the oxide material 902 is first removed from between the nanowire stacks. This will enable further processing of the layers in the nanowire stacks. In the instant example, the nanowire hardmasks 702 and the spacers 802 are removed as well. However, depending on the desired process flow, it may instead be favorable to leave these structures in place.

Figure 12:
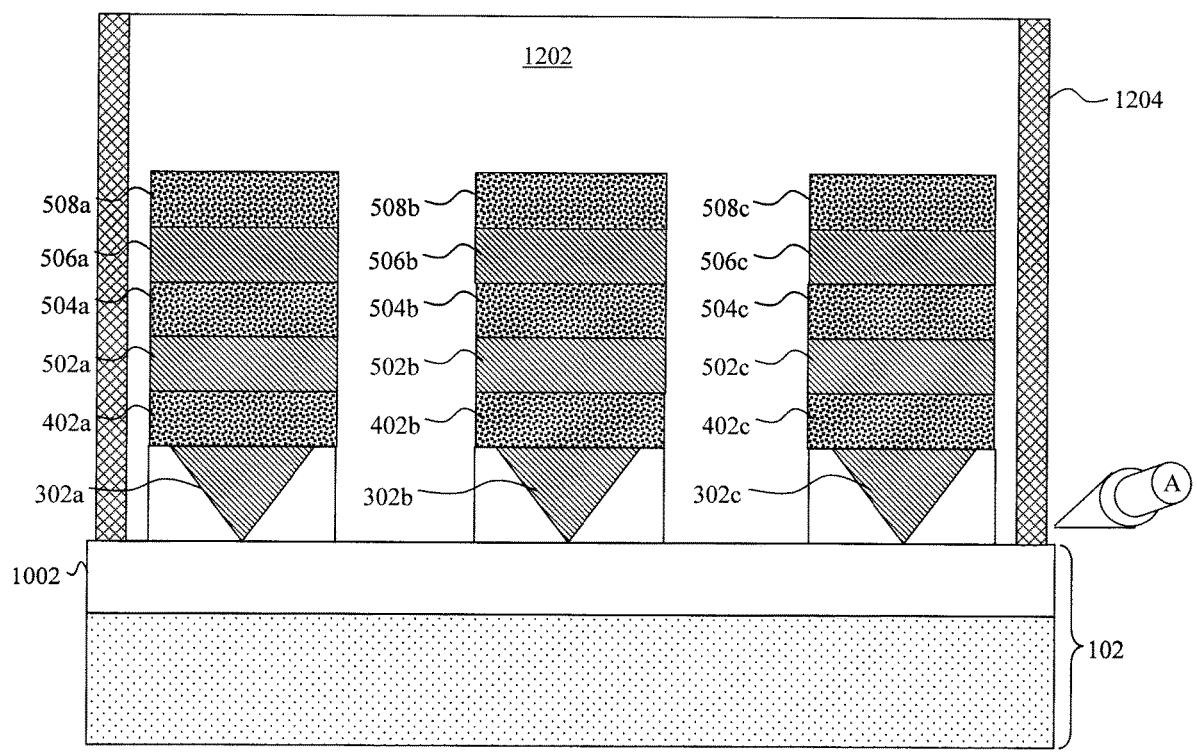
FIG. 12 is a cross-sectional diagram illustrating at least one dummy gate having been formed over a portion of each of the nanowire stacks that will serve as a channel region of the device according to an embodiment of the present invention.

As shown in FIG. 12, at least one dummy gate 1202 is formed over a portion of each of the nanowire stacks that will serve as a channel region of the device. The dummy gate 1202 can be formed by blanket depositing a dummy gate material onto, and in between, the nanowire stacks and then patterning the dummy gate material into one or more individual dummy gates 1202. Suitable dummy gate materials include, but are not limited to, poly-silicon (or poly-Si). As highlighted above, with the dummy gate 1202 in place, the source and drain regions of the device can then be formed.

As shown in FIG. 12, dummy gate spacers 1204 are preferably formed on opposite sides of the dummy gate 1202. The dummy gate spacers 1204 will be formed on all sides of the dummy gate 1202 and will serve to offset the gate from what will be the source and drain regions of the device.

Figure 13:
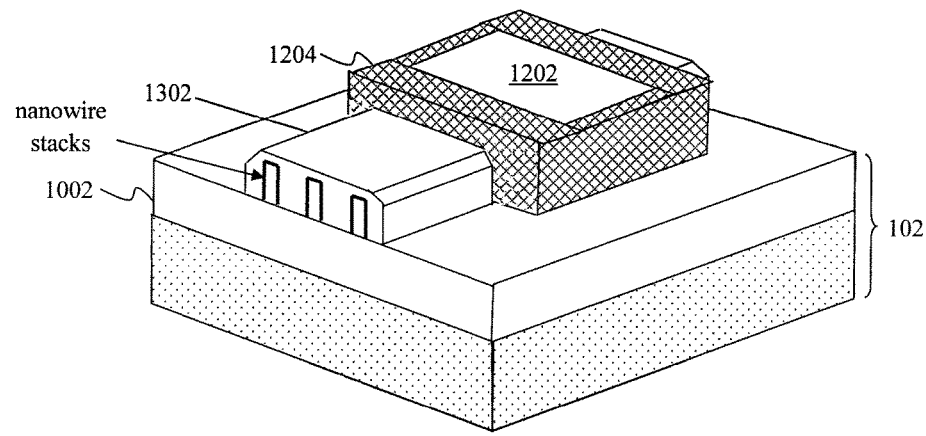
FIG. 13 is a three-dimensional diagram illustrating doped source and drain regions of the device having been formed according to an embodiment of the present invention.

Namely, switching to a three-dimensional view of the device (i.e., from a viewpoint A—see FIG. 12) shown in FIG. 13, formation of doped source and drain regions 1302 of the device is now described. According to an exemplary embodiment, doped source and drain regions 1302 are formed from an in-situ doped epitaxial material such as in-situ doped epitaxial Si SiC or SiGe. Suitable n-type dopants include but are not limited to phosphorous (P), and suitable p-type dopants include but are not limited to boron (B). The use of an in-situ doping process is merely an example. For instance, one may instead employ an ex-situ process such as ion implantation to introduce dopants into the source and drain regions 1302 of the device. It is also notable that, as shown in FIG. 13, the dummy gate spacers 1204 are present on all four sides of the dummy gate 1202.

Figure 14:
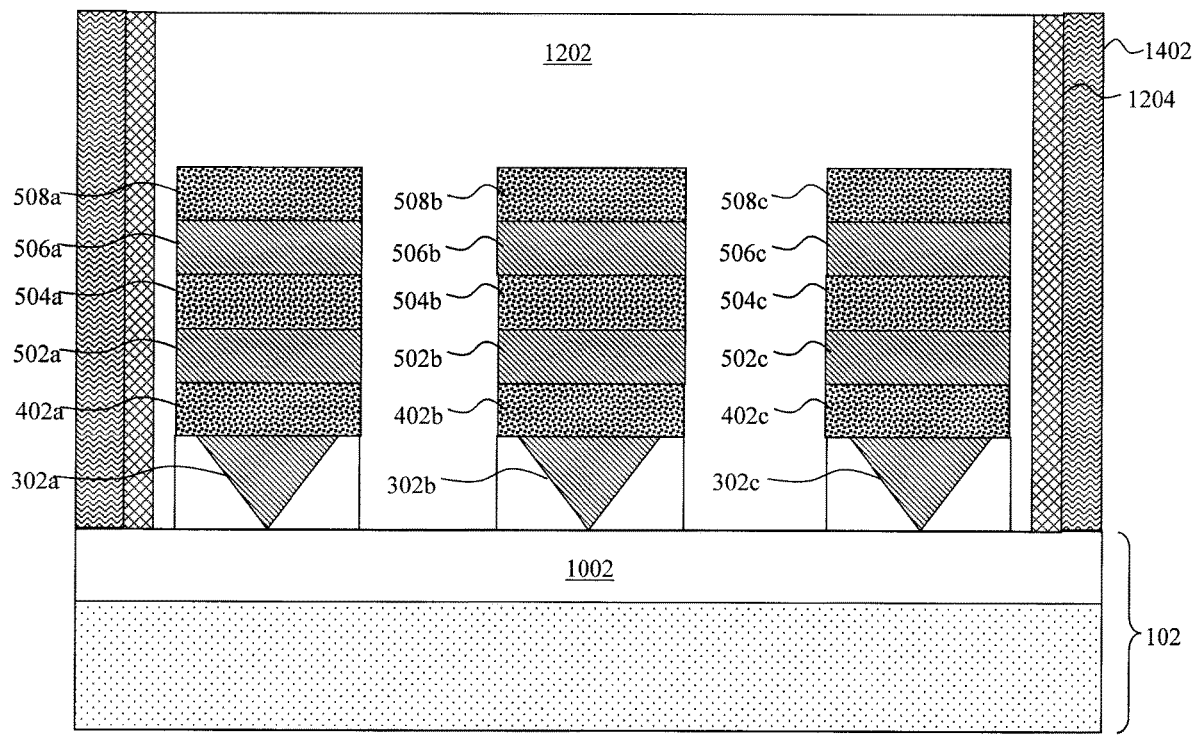
FIG. 14 is a cross-sectional diagram illustrating the dummy gate having been buried in a gap fill dielectric material according to an embodiment of the present invention.
Figure 15:
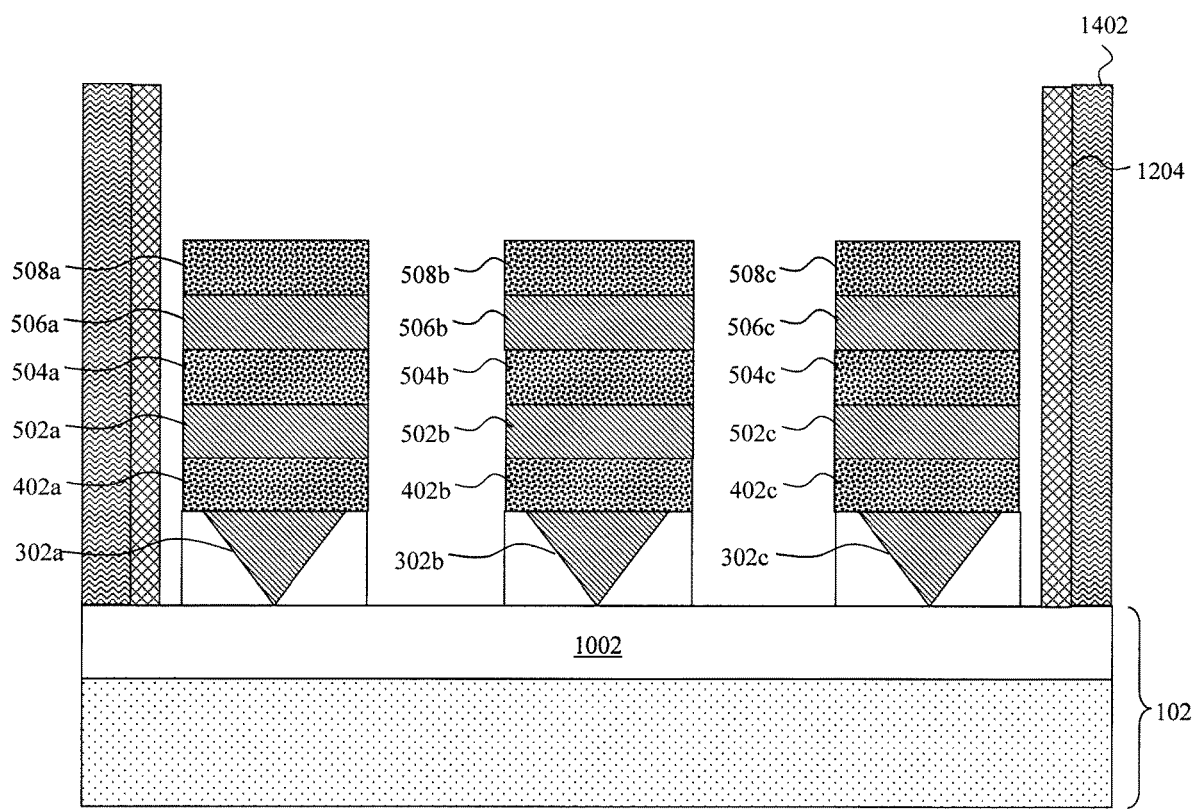
FIG. 15 is a cross-sectional diagram illustrating the dummy gate having been removed selective to the dielectric material and dummy gate spacers which forms a trench in the dielectric material exposing the portions of the nanowire stacks in the channel region of the device according to an embodiment of the present invention.

Referring once again to cross-sectional views of the structure, the dummy gate 1202 is then buried in a gap fill dielectric material 1402. See FIG. 14. Placement of the dielectric material 1402 will permit removal of the dummy gate 1202 from the channel region of the device, release of the channel material from the nanowire stacks, and the formation of a (e.g., gate-all-around or GAA) replacement gate in place of the dummy gate. In order to permit the dummy gate 1202 to be removed selective to the dielectric material 1402, as shown in FIG. 14 the dielectric material 1402 can be polished down to, and exposing, a top surface of the dummy gate 1202.

The dummy gate 1202 is then removed selective to the dielectric material 1402 and dummy gate spacers 1204, forming a trench in the dielectric material 1402 exposing the portions of the nanowire stacks in the channel region of the device. See FIG. 15. As will be described in detail below, the replacement gate will be formed in the trench. Thus, the trench left by removal of the dummy gate is also referred to herein as a gate trench. As provided above, the dummy gate 1202 can be formed from poly-Si. In that case, a poly-Si selective etching process can be used to remove the dummy gate 1202 selective to the dielectric material 1402 and the dummy gate spacers 1204.

As highlighted above, removal of the dummy gate exposes the portions of the nanowire stacks in the channel region of the device. According to an exemplary embodiment, portions of the Si layers 402, 504, 508, etc. are released from the nanowire stacks forming distinct (Si) nanowire channels. See FIG. 16. Further, according to an exemplary embodiment, each of the nanowire stacks contains multiple Si layers. In that case, the Si nanowires released from the nanowire stacks form what is referred to herein as a nanowire mesh. Releasing the nanowire channels from the nanowire stacks means that access can be gained all around each of the Si nanowires, and thus enables a gate-all-around or GAA device to be formed. In a GAA device, the gate (in this case the replacement gate) surrounds a portion of each of the nanowire channels.

Figure 16:
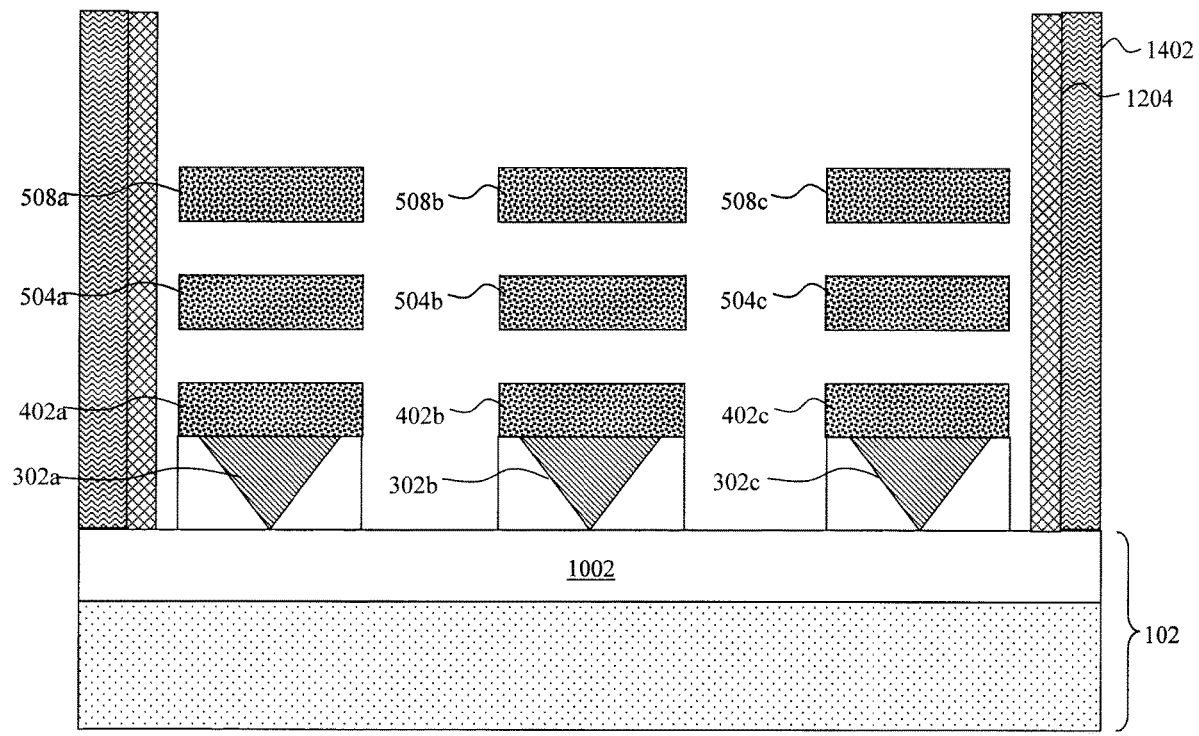
FIG. 16 is a cross-sectional diagram illustrating portions of the (channel) Si layers having been released from the nanowire stacks forming distinct (Si) nanowire channels according to an embodiment of the present invention.

In order to release the Si portions from the nanowire stacks, as shown in FIG. 16, the (sacrificial) portions of the SiGe layers 502, 506, etc. in the nanowire stacks are removed selective to the (channel) Si portions. By way of example only, in the instant case the SiGe layers can be removed from between the Si (nanowire channel) layers in the nanowire stacks as follows. A chemical etchant can be employed that exploits the lower oxidation potential of the SiGe layers as compared to the Si layers. Examples of such etchants include, but are not limited to, a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the SiGe layers can be selectively removed using a dry etching process, such as hydrogen baking at a temperature of from about 500° C. to about 700° C., and ranges therebetween, carried out for example in a conventional epitaxial reactor.

It is notable that, while the portions of the Si layers (i.e., the nanowire channels) are now shown to be suspended within the gate trench in the channel region of the device, the full (Si/SiGe) nanowire stacks remain intact within the source and drain regions of the device. Thus, the suspended Si nanowires are anchored at opposite ends thereof to the intact nanowire stacks in the source and drain regions of the device.

Figure 17:
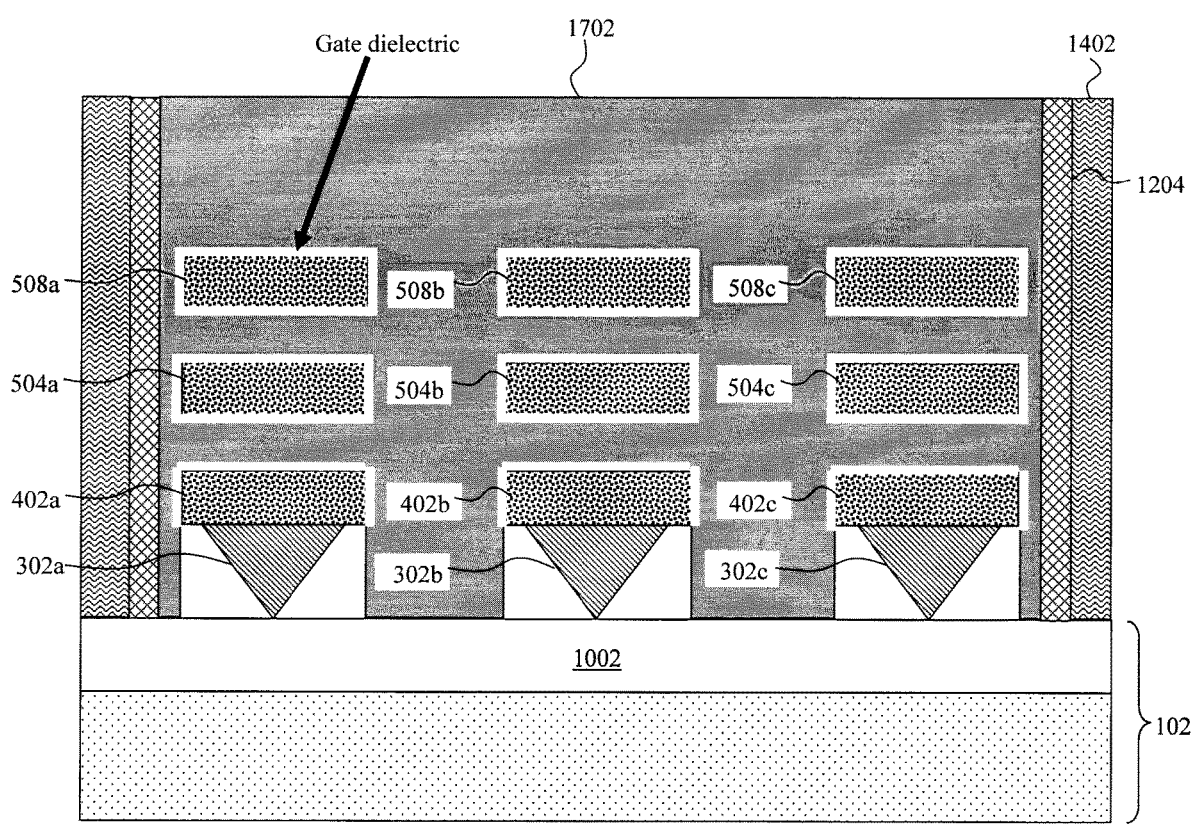
FIG. 17 is a cross-sectional diagram illustrating a replacement gate having been formed in the gate trench completely surrounding a portion of one or more of the nanowire channels in a gate-all-around (GAA) configuration according to an embodiment of the present invention.

A replacement gate 1702 is next formed in the gate trench. See FIG. 17. As shown in FIG. 17, the replacement gate 1702 surrounds a portion of each of the (Si) nanowire channels of the device in a GAA configuration (if so desired, the remaining portion of the bottommost SiGe layer 302 can be condensed onto dielectric isolation region 1002 using standard processes prior to forming the replacement gate, thereby enabling the replacement gate to fully surround the bottommost Si layer 402). According to an exemplary embodiment, the replacement gate is a metal gate and the present embodiment is a replacement metal gate process. Prior to placing the replacement gate 1702, a gate dielectric is preferably formed on the nanowire channels, so as to separate the nanowire channels from the replacement gate 1702. By way of example, in the case of a metal gate, a suitable gate dielectric includes high-κ materials such as hafnium oxide ($HfO_2$) and lanthanum oxide ($La_2O_3$). The term "high-κ" as used herein refers to a material having a relative dielectric constant κ which is much higher than that of silicon dioxide (e.g., a dielectric constant κ=25 for hafnium oxide rather than 4 for silicon dioxide).

To form the replacement gate 1702, a gate material or combination of materials is/are then deposited into the gate trench on the gate dielectric. By way of example only, in the case of a metal gate, a combination of gate metals may be used. For instance, a workfunction setting metal layer may be deposited onto the gate dielectric, followed by a filler metal layer. Suitable workfunction setting metals include, but are not limited to, n-type workfunction setting metals such as titanium nitride (TiN) and tantalum nitride (TaN), and p-type workfunction setting metals such as tungsten (W). Suitable filler metals include, but are not limited to, aluminum (Al). The replacement gate is now formed. Any further processing, if so desired, can be performed to complete the device.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device structure with dielectric isolation, comprising:
   a nanowire stack comprising:
   a partially oxidized bottom nanosheet layer;
   a first channel layer disposed on the bottom nanosheet layer, wherein opposite side portions of the first channel layer are vertically adjacent to oxidized portions of the bottom nanosheet layer; and
   a second channel layer disposed above and separated from the first channel layer; and
   a gate comprising one or more gate material layers disposed on the nanowire stack, including over and between the first channel layer and the second channel layer.

2. The device structure of claim 1, wherein the gate is disposed laterally adjacent to opposite sides of the first channel layer and the bottom nanosheet layer.

3. The device structure of claim 1, further comprising an insulating layer that extends laterally outward from beneath the nanowire stack, wherein:
   the bottom nanosheet layer is disposed on the insulating layer, and
   the gate is disposed vertically adjacent to the portions of the insulating layer that extend laterally outward from beneath the nanowire stack.

4. The device structure of claim 3, wherein the insulating layer comprises an oxidized portion of a doped semiconductor layer.

5. The device structure of claim 1, wherein the bottom nanosheet layer comprises oxidized SiGe.

6. The device structure of claim 1, wherein the bottom nanosheet layer is thicker than each of the first channel layer and the second channel layer.

7. The device structure of claim 3, further comprising gate spacers disposed laterally adjacent to the gate and vertically adjacent to the insulating layer.

8. The device structure of claim 7, wherein the insulating layer is a continuous insulating layer that extends from beneath the gate spacers to beneath the nanowire stack, and portions of the gate disposed between the gate spacers and the nanowire stack are disposed vertically adjacent to the continuous insulating layer.

9. The device structure of claim 1, wherein the second channel layer is surrounded by a gate dielectric layer and the first channel layer is only partially surrounded by a gate dielectric layer.

10. A device structure comprising:
    first and second nanowire stacks according to the nanowire stack of claim 1; and
    a continuous insulating layer that extends laterally outward from beneath the first and second nanowire stacks, wherein:
    the bottom nanosheet layer of each nanowire stack is disposed on the continuous insulating layer, and the gate is disposed vertically adjacent to the portions of the continuous insulating layer that extend laterally outward from beneath the nanowire stacks.

11. The device structure of claim 10, wherein:
the bottom nanosheet layer of each nanowire stack comprises insulating regions; and
a portion of the gate is disposed between the first and second nanowire stacks vertically adjacent to the continuous insulating layer and laterally adjacent to opposing insulating regions of the first and second nanowire stacks.

12. The device structure of claim 11, wherein the opposing insulating regions comprise oxidized SiGe.

13. A device structure with dielectric isolation, comprising:
a plurality of substantially parallel nanowire stacks disposed on a continuous insulating layer, each nanowire stack comprising:
a first channel layer, and
a second channel layer disposed above and separated from the first channel layer; and
a gate comprising one or more gate material layers that surround the second channel layers and only partially surround the first channel layers of each nanowire stack, wherein the gate is disposed between and laterally adjacent to the first channel layers and extends downwardly beyond lower surfaces of the first channel layers.

14. The device structure of claim 13, wherein:
the gate is disposed between and laterally adjacent to the first channel layers of the nanowire stacks and vertically adjacent to the portions of the continuous insulating layer that extend laterally outward from beneath the nanowire stacks; and
each of the nanowire stacks comprises a bottom nanosheet layer between the continuous insulating layer and the respective first channel layer such that the gate is disposed laterally adjacent to opposite sides of each of the bottom nanosheet layers.

15. The device structure of claim 13, wherein the continuous insulating layer comprises an oxidized portion of a doped semiconductor layer.

16. The device structure of claim 14, wherein each of the bottom nanosheet layers comprises oxidized SiGe.

17. The device structure of claim 14, wherein the bottom nanosheet layers are thicker than each of the first channel layers and the second channel layers.

18. The device structure of claim 13, wherein the device structure further comprises gate spacers disposed laterally adjacent to the gate and vertically adjacent to the continuous insulating layer.

19. The device structure of claim 18, wherein the continuous insulating layer extends from beneath the gate spacers to beneath the nanowire stacks, and portions of the gate disposed between the gate spacers and the nanowire stacks are disposed vertically adjacent to the continuous insulating layer.

20. The device structure of claim 13, wherein the second channel layers are surrounded by a gate dielectric layer and the first channel layers are only partially surrounded by the gate dielectric layer.

* * * * *